(12) United States Patent
Rallabandi et al.

(10) Patent No.: US 8,237,449 B2
(45) Date of Patent: Aug. 7, 2012

(54) BI-DIRECTIONAL HIGH SIDE CURRENT SENSE MEASUREMENT

(75) Inventors: Madan G. Rallabandi, Tucson, AZ (US); Scott C. McLeod, Oro Valley, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 279 days.

(21) Appl. No.: 12/788,896

(22) Filed: May 27, 2010

(65) Prior Publication Data

US 2011/0291675 A1  Dec. 1, 2011

(51) Int. Cl.
*G01R 31/08* (2006.01)
(52) U.S. Cl. .................................. 324/522; 324/76.82
(58) Field of Classification Search ............... 324/522
See application file for complete search history.

(56) References Cited

U.S. PATENT DOCUMENTS

| 5,479,130 A |   | 12/1995 | McCartney |         |
|-------------|---|---------|-----------|---------|
| 5,789,899 A | * | 8/1998  | van Phuoc et al. | 320/112 |
| 6,147,631 A | * | 11/2000 | Maulik et al. | 341/122 |

OTHER PUBLICATIONS

Alex Paikin; "Delta-Sigma ADC"; National Semiconductor; Apr. 2003; 2 pages. <http://www.hitequest.com/Kiss/DeltaSigma.htm>.
David A Johns and Ken Martin; "Switched Capacitor Circuits—Analog Integrated Circuit Design"; Nov. 15, 1996; pp. 433-434.

* cited by examiner

*Primary Examiner* — Thomas Valone
(74) *Attorney, Agent, or Firm* — Meyertons Hood Kivlin Kowert & Goetzel, P.C.; Jeffrey C. Hood; Mark K. Brightwell

(57) ABSTRACT

A system for measuring a voltage drop between two nodes in an electrical circuit, comprising a switched capacitor integrator (SCI), a comparator and a counter. The SCI alternately (a) captures charge onto a set of sampling capacitors and (b) selectively accumulates/transfers the charge onto a pair of integration capacitors, where the charge includes a first portion that is based on the voltage drop and a second portion that depends on a digital indicator signal. The comparator generates the digital indicator signal based on whether an analog output of the SCI is positive or negative. The counter counts a number of ones occurring in the digital indicator signal during a measurement interval. At the end of the measurement interval, the count value represents a measure of the voltage drop. Knowing the resistance between the two nodes, the voltage drop may be converted into a current measurement.

22 Claims, 11 Drawing Sheets

BI-DIRECTIONAL HIGH SIDE CURRENT SENSE MEASUREMENT

BACKGROUND OF THE INVENTION

1. Field of the Invention

This invention relates generally to the field of measurement circuit design, and more particularly, to an improved system and method for measuring the charging and discharging current in a battery-containing electrical system.

2. Description of the Related Art

Measurements are often performed to determine the total power being delivered by a battery to a load, or to determine the charging and discharging current of a battery system. In performing such measurements, it is desirable to accurately measure very small drops across a sense resistor that is carrying current from the battery to the load or from a charger to the battery. Both sides of the resistor may be at very high voltages depending on the battery used. Conventional Lithium ion (Li-ion) batteries in computers have DC voltages of 12V and higher. The drop across the sense resistor can be anywhere from microvolts to 100 mV.

According to the prior art, high side current measurements generally use an amplifier to amplify the voltage drop across the sense resistor and reference the amplified signal to ground, e.g., as shown in FIG. 1. (In FIG. 1, the amplifier is the device labeled "AMP".) The amplifier is typically configured to achieve its amplifying effect based on the gain inherent in transistors, e.g., bipolar junction transistors or field effect transistors. The amplifier makes it easy to provide the amplified signal to an analog-to-digital converter (ADC). The amplifier constitutes an error source in the signal path, and hence, its presence makes the measurement less accurate.

Many other problems and disadvantages of the prior art will become apparent to one skilled in the art after comparing such prior art with the present invention as described herein.

SUMMARY

In one set of embodiments, a system for measuring a voltage drop between two nodes in an electrical circuit may be configured as follows. The system may include a switched capacitor integrator (SCI), a comparator circuit, and a counter. The SCI may be coupled to the two nodes (of the electrical circuit) and configured to alternately (a) capture samples of charge onto a set of sampling capacitors and (b) selectively accumulate the charge samples onto a pair of integration capacitors. The charge samples may include a first charge sample that is based on the voltage drop. Furthermore, the charge samples may also include a second charge sample that is based on a reference voltage. The action of selectively accumulating includes accumulating the first charge sample. It also includes accumulating the second charge sample only when a digital indicator signal equals one. The SCI may be configured to generate an analog output signal that corresponds to a total accumulated charge on the integration capacitors.

The comparator circuit may be configured to generate the digital indicator signal based on the analog output signal. The digital indicator signal indicates whether the analog output signal is positive or negative at each active edge of a clock signal.

The counter may be configured to count a number of ones occurring in the digital indicator signal during a measurement interval. At the end of the measurement interval, the count value represents a measure of the voltage drop.

In some embodiments, the electrical circuit may include a battery, a load device, and a sense resistor, where the two nodes (of the electrical circuit) correspond to the two ends of the sense resistor.

In some embodiments, the electrical circuit may include a battery, a battery charger, and a sense resistor, where the two nodes correspond to the two ends of the sense resistor.

In some embodiments, the system may also include a means for computing a current flow between the two nodes based on the count value and a known resistance value of the resistor.

In some embodiments, the charge samples also include a third charge sample that is based on an offset voltage. The offset voltage may be set to a value that implies a mid-scale output from the counter when the voltage drop equals zero. For example, in one embodiment, the offset voltage equals one half of the reference voltage.

In some embodiments, the analog output signal equals an integral of a signal given by the expression: $G1*Vsense - G2*VREF*dout$, where Vsense is the voltage drop, where VREF is the reference voltage, where dout is the digital indicator signal, where G1 and G2 are gain factors determined by capacitances of the sampling capacitors and capacitances of the integration capacitors.

In some embodiments, the SCI may include a first set of switches and a second set of switches, where switches of the first set are configured to close during a first phase interval of the clock signal, where switches of the second set are configured to close during a second phase interval of the clock signal, where the first phase interval and the second phase interval are disjoint intervals.

In some embodiments, the sampling capacitors may include a pair of input capacitors that are configured to capture the first charge sample, where the capacitance of the input capacitors is greater than a capacitance of the integration capacitors.

In some embodiments, the sampling capacitors may include a pair of input capacitors that are configured to capture the first charge sample, where the SCI includes a first pair of gated connections between the two nodes and the pair of input capacitors, where the SCI also includes a second pair of gated cross connections between the two nodes and the pair of input capacitors.

In some embodiments, the SCI may include an operational transconductance amplifier (OTA).

In some embodiments, the SCI may be configured to reset the total accumulated charge on the integration capacitors to zero at the end of the measurement interval.

In one set of embodiments, a system for measuring a voltage drop between two nodes in an electrical circuit may be configured as follows. The system may include a switched capacitor integrator (SCI) and an analog-to-digital converter (ADC).

The SCI may be coupled to the two nodes and may be configured to alternately (a) capture charge onto a set of sampling capacitors and (b) transfer the charge onto a pair of integration capacitors, where the charge includes at least a first charge component that is based on the voltage drop. The SCI may be configured to generate an output signal that represents an amplification of the voltage drop.

The ADC may be configured to capture measurements of the output signal, where the measurements of the output signal represent measurements of the voltage drop. The SCI may be configured to zero any charge on the integration capacitors after the ADC captures each measurement of the output signal.

In some embodiments, the ADC is a dual slope ADC. In other embodiments, the ADC is a pipelined ADC. In yet other embodiments, the ADC is a delta-sigma ADC.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings, in which.

Figure 1:
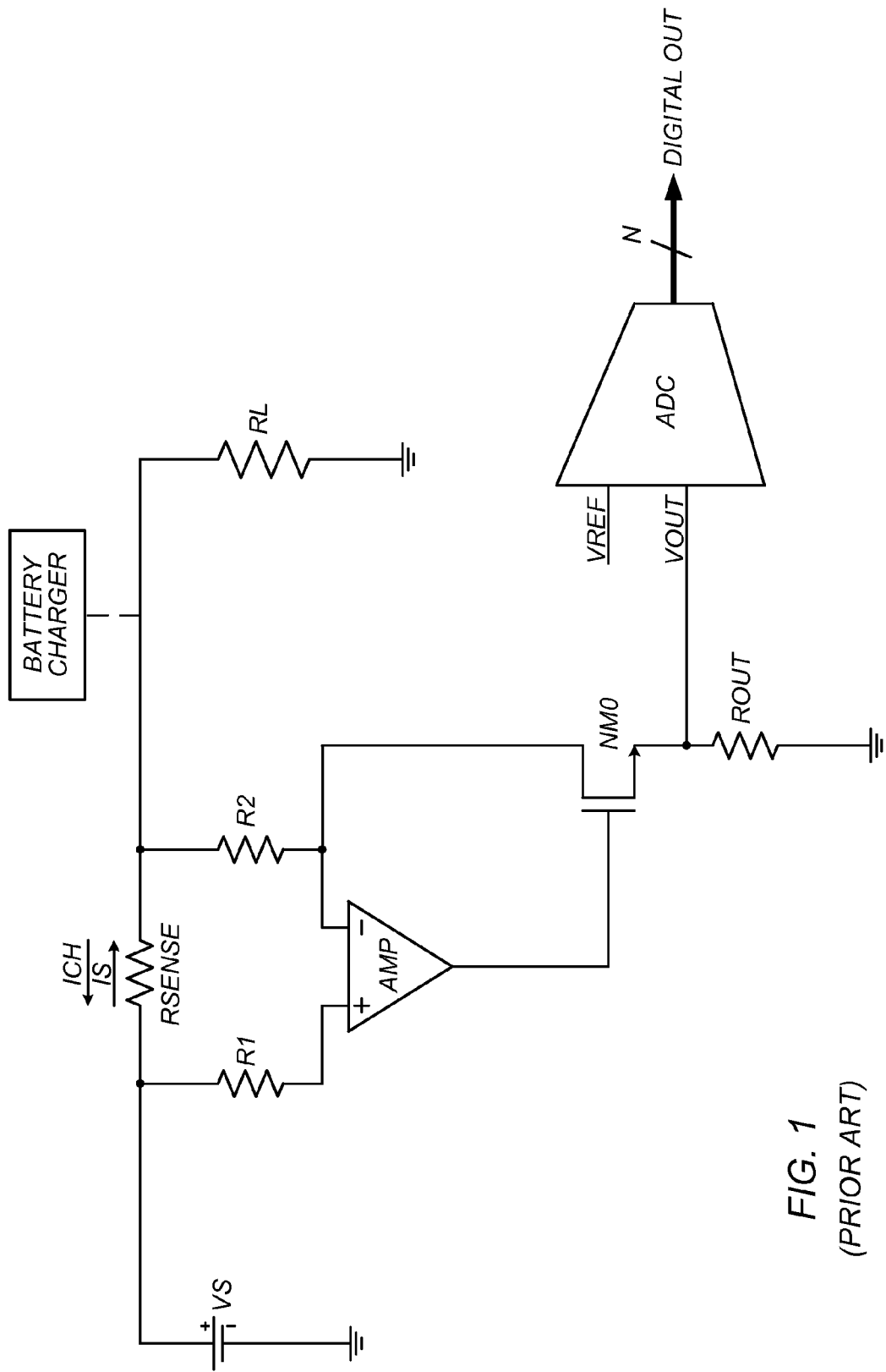
FIG. 1 shows a current measurement system according to the prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

Figure 2:
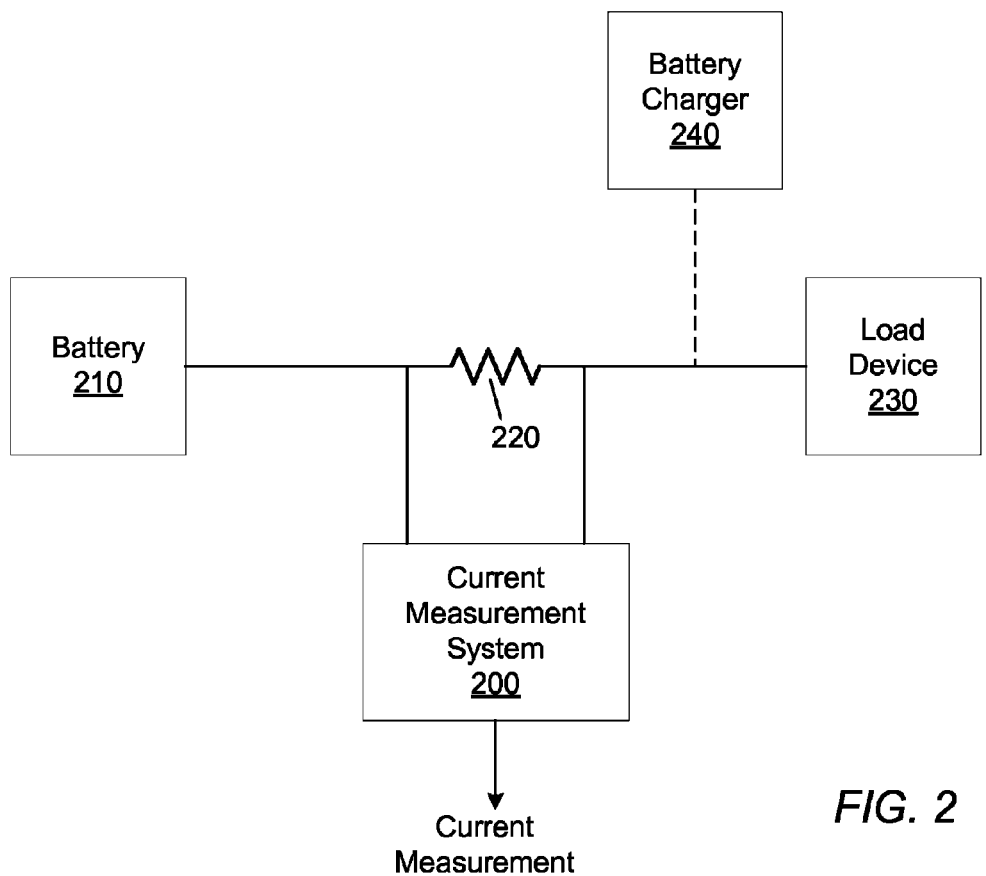
FIG. 2 illustrates one embodiment of a current measurement system.

FIG. 2 illustrates one embodiment of a system 200 configured for the measurement of current flowing from a battery or current flowing to the battery. Current measurement system 200 couples to an electrical circuit including a battery 210, a sense resistor 220, and one or more other devices. The one or more other devices may include a load device 230 and a battery charger 240. For example, in one embodiment or mode of operation, the load device 230 is present but the battery charger 240 is absent. In another embodiment or mode of operation, the battery charger 240 is present but the load device 230 is absent. In yet another embodiment or mode of operation, both the load device and the battery charger are both present.

The load device 230 may be any sort of power consuming device.

The battery 210 may be removable and/or replaceable.

The battery charger 240 may also be removable (as suggested by the dashed line).

Battery 210 couples to one end of the sense resistor 220. The one or more other devices couple to the other end of the sense resistor. Current measurement system 200 couples to both ends of the sense resistor. Current measurement system 200 is configured to measure the voltage drop across the sense resistor. Current measurement system 200 may also be configured to generate an estimate for the current through the sense resistor based on the measured voltage drop and on the known resistance value of the sense resistor. Thus, current measurement system 200 may be used to measure the charging and/or discharging current of the battery 210. The current measurement system 200 may also be configured to generate an estimate of the power being delivered by or to the battery.

Figure 3:
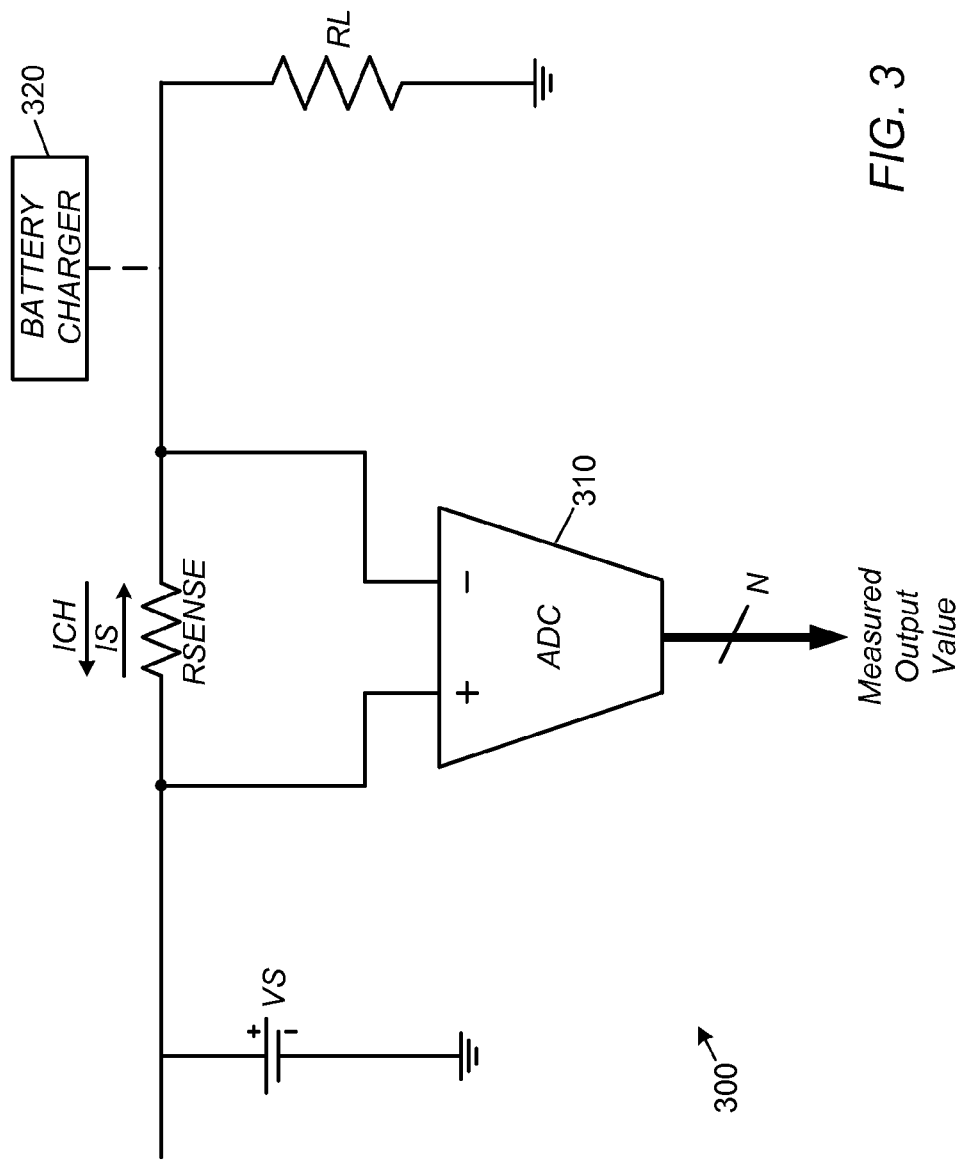
FIG. 3 illustrates one embodiment of a circuit for performing current measurement using an analog-to-digital converter that has amplification built into its input stage.

FIG. 3 illustrates one embodiment of a system 300 for performing current measurement. The system may include a sense resistor RSENSE and an ADC 310. One end of the sense resistor may couple to a battery (of voltage VS), and the other end may couple to a load device. (The load device is represented in FIG. 3 by a resistor RL. The load device might be any sort of power consuming device.)

ADC 310 captures measurements of the voltage drop Vsense across the sense resistor. The current IS through the sense resistor may then be computed from the measured voltage drop and the known resistance of the sense resistor. The input impedance of the ADC 310 is preferably large enough that one can reasonably interpret the current IS as being (or as being approximately equal to) the current flowing through the load device. Vsense is defined as the voltage of the battery end of the sense resistor minus the voltage of the load end of the sense resistor.

The sense resistor RSENSE is preferably small, to avoid consuming power that would otherwise be available to the load. Thus, Vsense may be a small voltage. In some embodiments, to effect a measurement of Vsense, some sort amplification may be required. However, it should be noted that the design principles described herein naturally generalize to contexts where the voltage drop is large. In those contexts, attenuation of the voltage drop may be required.

In the prior art, the voltage drop across a sense resistor generally gets amplified in a separate amplifier prior to being fed into an analog-to-digital converter. The separate amplifier is typically based on the gain inherent in transistors such as bipolar junction transistors (BJTs) or field effect transistors (FETs). In contrast, in system 300 the amplification function is integrated into the front end of ADC 310, i.e., a front end that employs a switched-capacitor integrator to perform the amplification function. System 300 does not include a separate amplifier in the signal path and hence eliminates a source of error.

The system 300 also allows a battery charger 320 to be connected to the load end of the sense resistor. The battery charger may be connected with or without disconnection of the load device. When the battery charger is connected, current ICH flows through the sense resistor. As above, the current ICH may be computed from a measurement of the voltage drop Vsense. However, in this case, Vsense will be a negative quantity.

While system 300 is described above as being configured for measurement of a voltage drop across a sense resistor, it should be noted that the design principles described herein naturally generalize to the measurement of voltage drop and/or current between any two nodes in any electrical circuit. Thus, in other embodiments, Rsense may be replaced by a capacitor, an inductor, or an arbitrary circuit. Furthermore, the battery may be replaced by any sort of electrical device.

Figure 4:
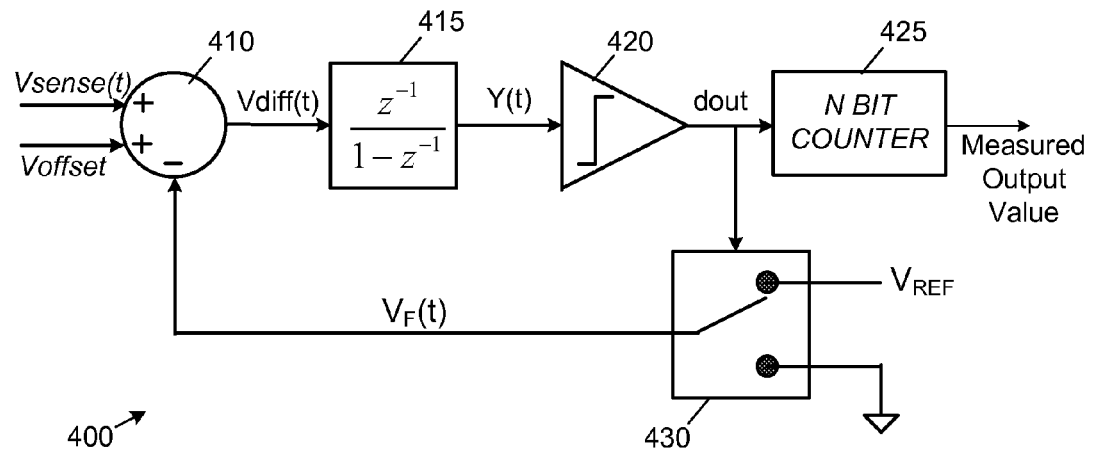
FIG. 4 shows one embodiment of ADC 310 based on a delta-sigma topology.

FIG. 4 shows an embodiment 400 of ADC 310 in terms of a delta-sigma topology. However, other ADC topologies may be used as well.

ADC embodiment 400 includes circuit 410, an integrator 415, a comparator 420, a counter 425 and a feedback unit 430.

The circuit 410 operates on the voltage drop Vsense(t) and a feedback signal $V_F(t)$ to generate a difference signal Vdiff(t) according to the expression:

$$V\text{diff}(t) = V\text{sense}(t) - V_F(t). \tag{1}$$

In some embodiments, circuit 410 also receives a voltage offset Voffset, in which case the difference signal Vdiff(t) is generated according to the expression:

$$V\text{diff}(t) = V\text{sense}(t) - V_F(t) + V\text{offset}. \tag{2}$$

Integrator 415 continuously integrates the difference signal to generate an intermediate signal Y(t).

Comparator 420 operates on the intermediate signal Y(t) to generate a digital output signal (dout) that indicates whether the intermediate signal is positive or negative at each active edge of a clock signal. (The active edges may be the rising edges of the clock signal. However, in an alternative embodiment, the active edges may be the falling edges.) Thus, the comparator acts as a 1-bit quantizer. The digital output signal takes the value one when the intermediate signal is positive, and takes the value zero when the intermediate signal is negative. The digital output signal may be supplied to feedback unit 430 and to counter 425.

The feedback unit 430 may be configured to generate the feedback signal $V_F(t)$ by switching between a reference voltage and ground, where the switching is controlled by the digital output signal dout. When the digital output signal equals one, the feedback unit connects the feedback path to the reference voltage: $V_F(t) = V_{REF}$ When the digital output signal equals zero, the feedback unit connects the feedback path to ground: $V_F(t) = 0$.

Counter 425 may be configured to count the number of ones occurring in the digital output signal during a measurement interval. The final value of the count, i.e., value of the count at the end of the measurement interval, corresponds to the value of the voltage drop Vsense. At the end of the measurement interval, the final count value may be provided to an output buffer, and the counter 425 may be reset to zero in preparation for the next measurement interval.

In some embodiments, the counter 425 may be replaced with a more sophisticated filter, e.g., a sinc filter.

The final count value is provided to additional circuitry (not shown) for computing the value of the current IS or ICH, as the case may be. In alternative embodiments, the final count value may be made available to a computer (or processor), and thus, the current value may be computed by a program executing on the computer.

Figure 5:
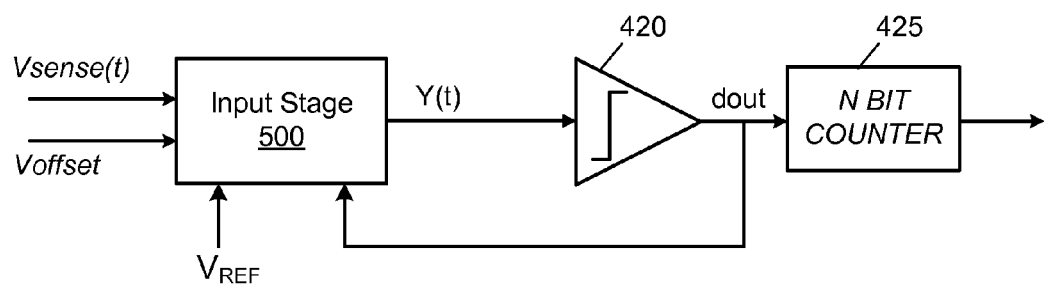
FIG. 5 shows one embodiment of ADC 310 where the functions of circuit 410, integrator 415 and feedback unit 430 are combined into an input stage 500.

In some embodiments, the functions of circuit 410, integrator 415 and feedback unit 430 may be combined into an input stage 500, as shown in FIG. 5. Input stage 500 receives the voltage drop Vsense, the reference voltage $V_{REF}$ and the digital output signal dout. In some embodiments, input stage 500 may also receive the offset voltage Voffset.

Input stage 500 uses a switched-capacitor integrator to periodically capture samples corresponding to the difference signal Vdiff(t), and to periodically integrate and amplify the captured samples (onto integration capacitors of the switched capacitor integrator) in order to generate the intermediate signal Y(t).

Figure 6A:
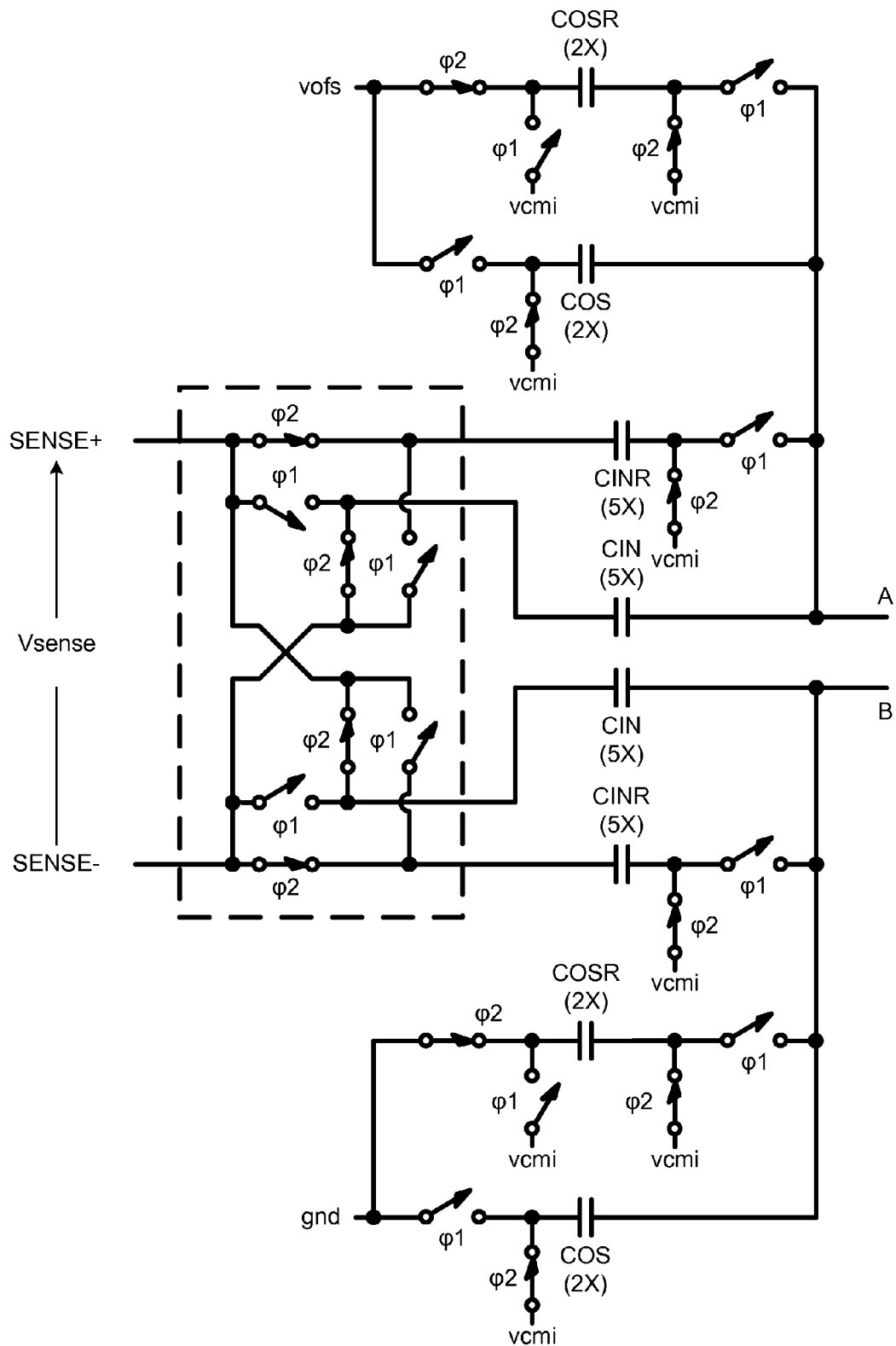
FIGS. 6A and 6B show one embodiment of the input stage 500 in terms of a switched-capacitor integrator circuit.
Figure 6B:
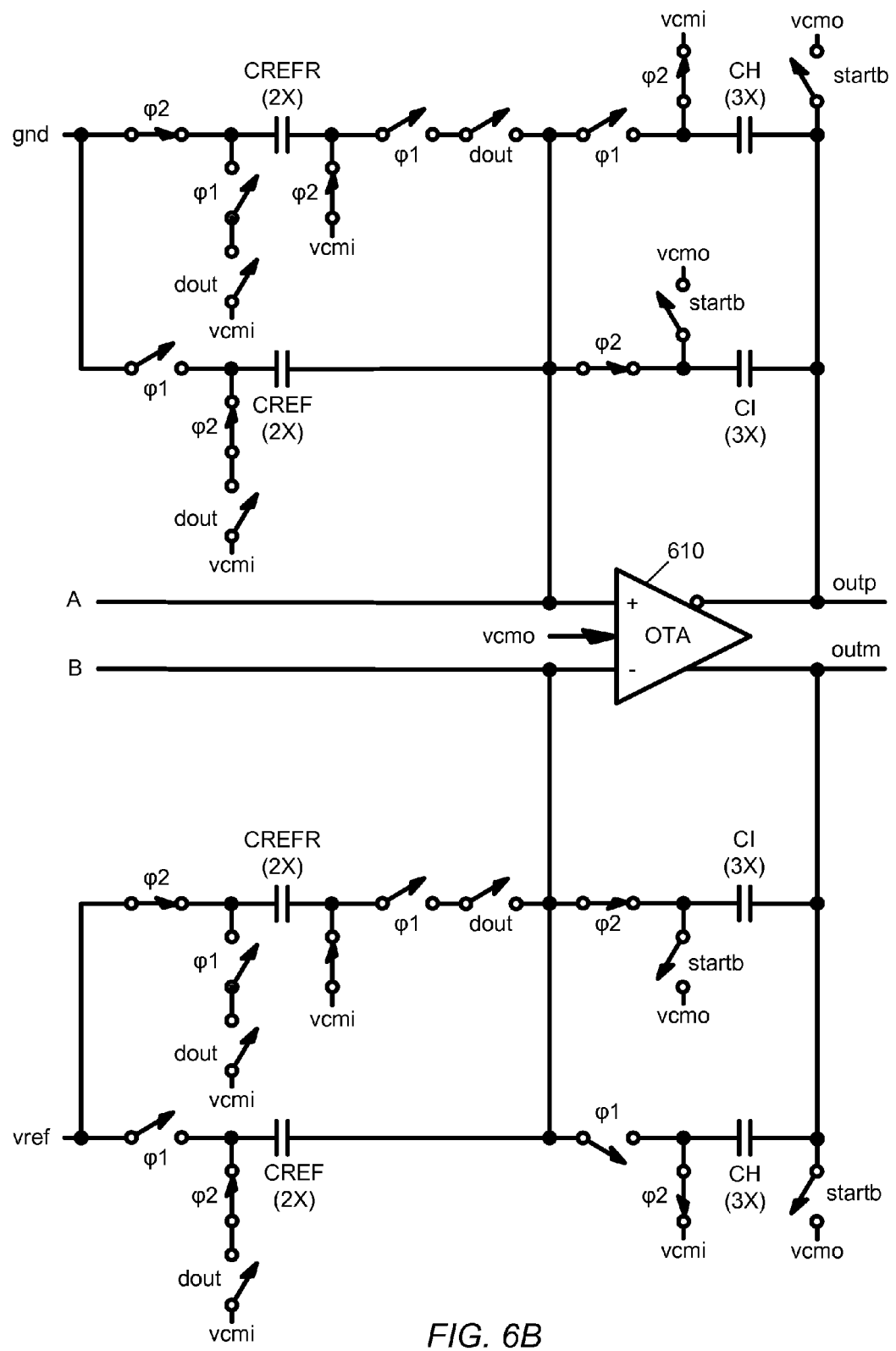

FIGS. 6A and 6B show a circuit diagram for the input stage 500, according to one embodiment. Input stage 500 includes a set of switches, a set of capacitors, and an operational transconductance amplifier (OTA) 610.

The set of capacitors may include: a pair of input capacitors, each of capacitance CIN; a pair of input-charge-replacement capacitors, each of capacitance CINR; a pair of offset capacitors, each of capacitance COS; a pair of offset-charge-replacement capacitors, each of capacitance COSR; a pair of reference capacitors, each of capacitance CREF; a pair of reference-charge-replacement capacitors, each of capacitance CREFR; a pair of integration capacitors, each of capacitance CI; and a pair of hold capacitors, each of capacitance CH. The notation "(kX)" appearing immediately underneath each capacitor indicates the number of unit capacitors that comprise the specified capacitor. For example, if CI has (3×), it would be made up of three unit capacitors.

The switches are partitioned into a number of subsets. Switches in a first subset are configured to close during a phase interval φ1 of the clock signal. Switches of the second subset are configured to close during a phase interval φ2 of the clock signal. The phase intervals φ1 and φ2 may be disjoint and cover the full cycle of 2π radians. In other words, the φ1 switches may close during a defined portion of each clock cycle, and the φ2 switches may close during a different defined portion of each clock cycle, in such a fashion that the two portions cover the entire clock cycle and do so without overlapping.

In one embodiment, the φ1 switches close when the clock signal is high, and the φ2 switches close when the clock signal is low. A wide variety of other embodiments are contemplated for the choice of phase intervals φ1 and φ2. There is no requirement that the two phase intervals be equal in length.

In addition to the φ1 switches and the φ2 switches, there are a number of switches that are controlled by the digital output signal dout. See the four switches in FIG. 6B that are labeled "dout". Those switches are configured to close when dout takes the value one, and are open otherwise. They are instrumental in implementing the subtraction of the feedback signal indicated in expressions (1) and (2) above.

Input stage 500 also includes a number of switches that are configured to discharge the integration capacitors CI at the end of each measurement interval in order to reset those capacitors for the next measurement interval. See the four switches in FIG. 6B that are labeled "startb".

In some embodiments, the switches (or, at least a subset of the switches) may be realized using MOS transistors, e.g., NMOS transistors.

Input stage 500 operates by alternately (a) capturing charge onto the capacitors CIN, the capacitors COS and the capacitors CREF and (b) transferring the charge to the integration capacitors CI. The charge that accumulates on the integration capacitors over time represents the integral of the difference signal Vdiff(t), or, more generally, a linear combination of Vsense(t), $V_F(t)$ and Voffset(t).

During the phase interval φ1, the input capacitors CIN develop a total charge equal to Vsense*CIN, the capacitors COS develop a total charge equal to Voffset*COS, and the capacitors CREF develop a total charge of −VREF*CREF. (These assertions follow from applying the basic Q=CV equation to each capacitor together with the "virtual ground principle" of op amp theory, i.e., the principle that the inverting and non-inverting inputs of an operational amplifier coupled with feedback are constrained to be at the same potential.)

During the phase interval φ2, the charge on the input capacitors CIN transitions from CIN*Vsense to −CIN*Vsense; the charge on the capacitors COS transitions from COS*Voffset to zero; and the charge on the capacitors CREF transitions from −VREF*CREF to zero if dout is high or remains at −VREF*CREF if dout is low. Thus, the net charge ΔQ that is added to the existing charge on the integration capacitors CI during phase interval φ2 is equal to:

$$\Delta Q = 2*Vsense*CIN + Voffset*COS - dout*VREF*CREF, \quad (3)$$

where dout=1 or 0.

The intermediate signal Y(t)=outp(t)−outm(t) is given by Y(t)=Q(t)/CI, where Q(t) is the total charge on the integration capacitors CI at any given time t. Thus, the intermediate signal Y(t) at the end of phase interval φ2 is related to the Y(t) at the beginning of phase interval φ2 by the expression:

$$Y(\varphi 2 \text{ end}) = Y(\varphi 2 \text{ beginning}) + \Delta Q/CI \quad (4)$$

$$= Y(\varphi 2 \text{ beginning}) + 2*Vsense*CIN/CI + Voffset*COS/CI - VREF*dout*CREF/CI. \quad (5)$$

In particular, observe that Vsense experiences a gain of 2CIN/CI. The gain may be controlled by setting the capacitance ratio CIN/CI. The value of the gain may be chosen based on the expected magnitude range of Vsense. Smaller magnitude ranges may require larger values of gain.

As noted above, the sense resistor may be coupled to a battery (or other type of power source). Thus, both ends of the sense resistor may be at voltages that are large compared to the voltage drop across the sense resistor. Because input stage 500 includes capacitors CIN at its input (where it couples to the ends of the sense resistor), the remaining circuitry of the input stage 500 may operate in a relatively low voltage range. For example, the supply voltage of the OTA may be significantly lower than the voltages at the ends of the sense resistor. The input capacitors provide isolation between a high-voltage domain on one side and a low (or lower) voltage domain on the other side. For example, in some embodiments, the lower of the two voltages at the ends of the sense resistor is at least fifty times larger than the supply voltage of the OTA.

In one embodiment, the input stage 500 may include a bank of capacitors with different values for the capacitance CIN, where any one of them may be selected under host software control. Thus, the ratio CIN/CI may be controlled by software.

Observe the cross connections that connect the SENSE+ input to the lower CIN capacitor and connect the SENSE− input to the upper CIN capacitor. Those connections are enabled (made to be conductive) only during phase interval φ2. They are responsible for the final charge state in the charge transition from CIN*Vsense to −CIN*Vsense, and thus, for the factor of two in the voltage gain multiplier 2CIN/CI.

As described above, current may be flowing through the sense resistor in either direction, depending on whether the system is being used in the battery draining mode or the battery charging mode. Thus, the voltage drop Vsense might be positive or negative. The system 300 may be configured to handle both cases by appropriate use of the offset voltage (Voffset). For example, in one embodiment, the voltage offset may be set equal to half of the reference voltage: Voffset=$V_{REF}$/2. Under that assumption, when there is no current flowing across the sense resistor, Vsense equals zero, and the input stage 500 will be integrating $V_{REF}$/2, and hence, the output of the ADC 310 will be midscale. When there is current flowing from the battery to the load (which is interpreted as being a positive drop across the sense resistor), the output of the ADC 310 will be more than mid scale, and when the current is flowing from the battery charger to the battery (being interpreted as negative voltage drop across the sense resistor), the output of the ADC will be less than mid scale. Thus, by an appropriate choice of the offset voltage, the ADC 310 may be configured to handle any value of Vsense in a range that covers both positive and negative values.

As can be seen, the implementation described above does not need a separate amplifier to amplify the voltage drop across the sense resistor because amplification is built into the switched-capacitor integrator of input stage 500, and is especially due to the ratio of capacitances of the input capacitors CIN and the reference capacitors CREF.

Because the separate amplifier used in prior art systems is an error source, its elimination in the above implementation implies a more accurate reading from the ADC 310.

Figure 7:
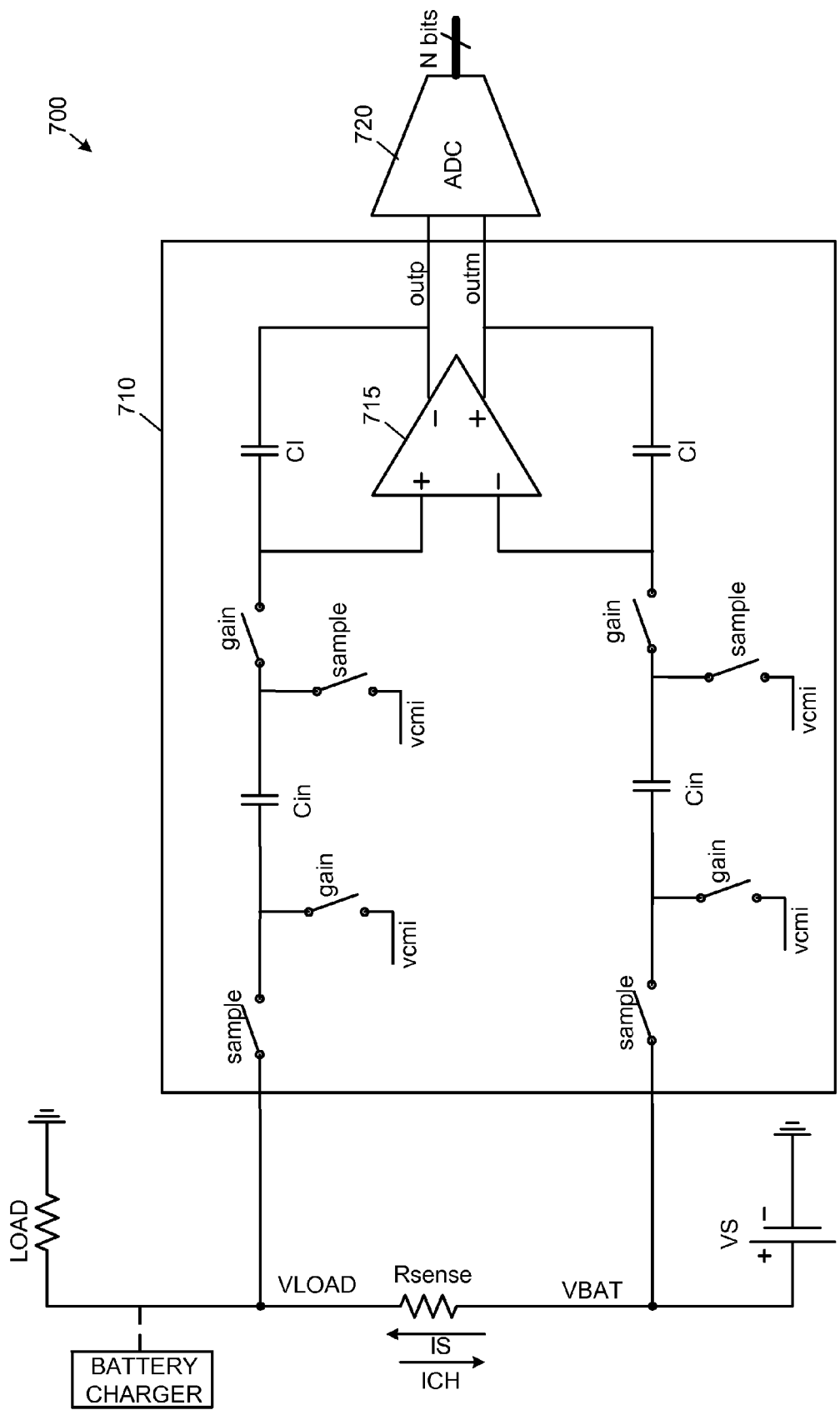
FIG. 7 illustrates one embodiment of a current measurement system that includes a switched capacitor integrator (SCI) coupled to a conventional analog-to-digital converter.

In some embodiments, a switched-capacitor front end may be used in conjunction with a conventional ADC (i.e., a prior art ADC) to measure the voltage drop Vsense across the sense resistor. FIG. 7 illustrates one such embodiment. System 700 includes a front end 710 and a conventional ADC 720.

Front end 710 includes a set of switches, a set of capacitors and an OTA 715. As with input stage 500, front end 710 alternately (a) captures samples of charge onto the input capacitors CIN during a sampling phase interval and (b) transfers the captured samples onto the integration capacitors CI during a gain phase interval; the gain experience by Vsense is controlled by the capacitance ratio CIN/CI. However, in contrast with input stage 500, front end 710 is configured to zero out the charge on the integration capacitors CI after the ADC 720 has read the value of the intermediate signal Y(t) =outp(t)−outm(t). (For example, ADC 720 may read the value of the intermediate signal Y(t) at the end of the gain phase interval, and then the integration capacitors may be zeroed sometime during the sampling phase interval.) Thus, in system 700, the intermediate signal represents the instantaneous value of Vsense and not the integral of Vsense. So the output of the ADC 720 constitutes a measurement of Vsense. That measurement may be converted to a current measurement by a straight-forward application of Ohm's law: Current=Vsense/Rsense.

The mechanism for zeroing out the charge is not shown, but may be easily achieved by using additional switches to briefly couple both ends of each integration capacitor CI to vcmi (or some other convenient voltage).

Figure 8:
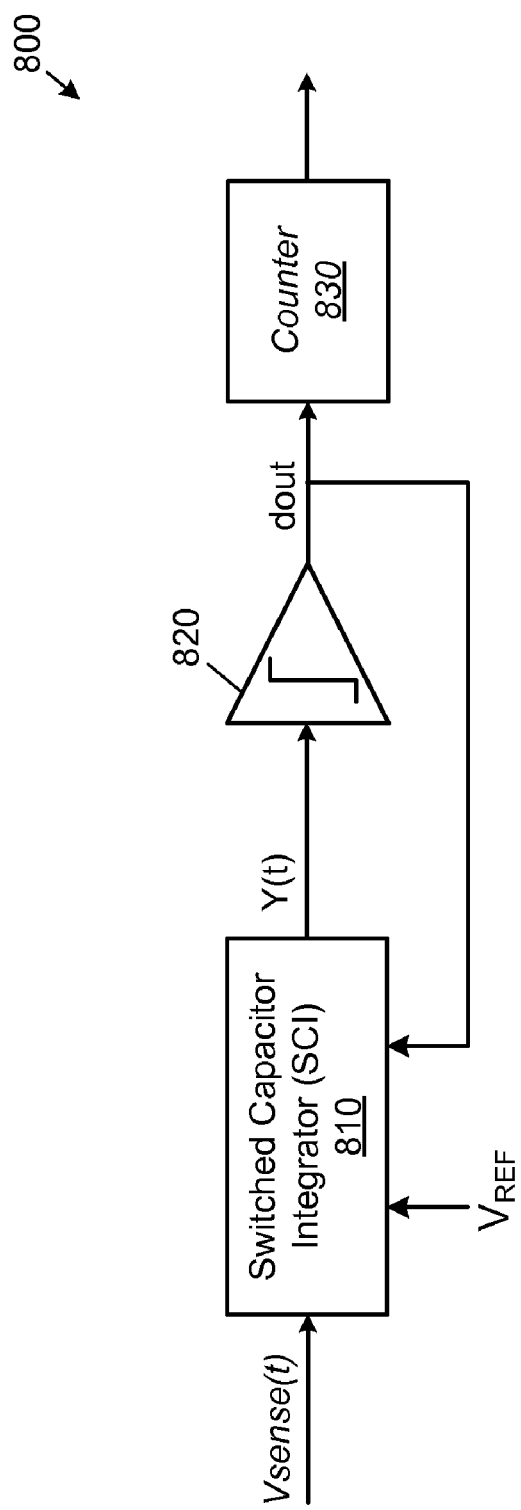
FIG. 8 illustrates one set of embodiments of a system for measuring voltage drop between two nodes in an electrical circuit.

In one set of embodiments, a system 800 for measuring a voltage drop between two nodes in an electrical circuit may be configured as shown in FIG. 8. System 800 includes a switched capacitor integrator (SCI) 810, a comparator circuit 820 and a counter 830.

The SCI 810 may be coupled to the two nodes (of the electrical circuit) and may be configured to alternately (a) capture samples of charge onto a set of sampling capacitors and (b) selectively accumulate the charge samples onto a pair of integration capacitors. The charge samples may include a first charge sample that is based on the voltage drop, and a second sample that is based on a reference voltage. The action of selectively accumulating the charge samples includes accumulating the first charge sample. The action of selectively accumulating the charge samples also include accumulating the second charge sample only if a digital indicator signal equals one. The SCI may be configured to generate an analog output signal that corresponds to a total accumulated charge on the integration capacitors. FIGS. 6A and 6B show one embodiment of SCI 810, where the sampling capacitors include capacitors CIN, capacitors CREF and capacitors COS, where the first charge sample is the charge sample captured onto the capacitors CIN, where the second charge sample is the charge sample captured onto the capacitors CREF, where the integration capacitors are the capacitors CI.

The comparator circuit 820 may be configured to generate the digital indicator signal based on the analog output signal. The digital indicator signal indicates whether the analog output signal is positive or negative at each active edge of a clock signal.

Counter 830 may be configured to count a number of ones occurring in the digital indicator signal during a measurement interval. At the end of the measurement interval, the count value of the counter represents a measure of the voltage drop. For example, the expression VREF*(count value)/N may be used as an estimate for the voltage drop, where N is the number of clock periods in the measurement interval. System 800 may include a means for computing the voltage drop based on this expression. For example, in one embodiment, the computing means may be a multiplier circuit configured to multiply the count value by the constant VREF/N. In another embodiment, the computing means may be a lookup table. In yet another embodiment, the computing means may be a host computer executing under program control. The host computer may read the count value generated by the counter 830 and then compute the voltage drop based on the count value.

In some embodiments, the electrical circuit may include a battery, a load device, and a sense resistor, where the two nodes of the electrical circuit correspond to the two ends of the sense resistor. For example, the battery may be coupled between one end of the sense resistor and ground; the load device may be coupled between the other end of the sense resistor and ground.

In some embodiments, the electrical circuit may include a battery, a battery charger, and a sense resistor, where the two nodes of the electrical circuit correspond to the two ends of the sense resistor. For example, the battery may be coupled between one end of the sense resistor and ground; the battery charger may be coupled between the other end of the sense resistor and ground.

In some embodiments, the electrical circuit may include a resistor coupled between the two nodes. In that case, the system may also include a means for computing a current through the resistor based on the count value and a known resistance value of the resistor. For example, the current computing means may be a multiplier which is configured to multiply the voltage drop by the inverse of the resistance value. As another example, the current computing means may be a lookup table. As yet another example, the current computing means may be a host computer (or processor) executing under program control.

In some embodiments, the charge samples captured onto the sampling capacitors also include third charge sample that is based on an offset voltage. For example, in FIG. 6A, the third charge sample is the charge sample that are captured onto the capacitors COS.

In some embodiments, the offset voltage is set equal to one-half of the reference voltage.

In some embodiments, the analog output signal generated by the SCI equals an integral of a signal given by the expression: $G1*Vsense-G2*VREF*dout$, where Vsense is the voltage drop, where VREF is the reference voltage, where dout is the digital indicator signal, where G1 and G2 are gain factors determined by capacitances of the sampling capacitors and capacitances of the integration capacitors.

In some embodiments, the SCI includes a first set of switches and a second set of switches, where switches of the first set are configured to close during a first phase interval of the clock signal, where switches of the second set are configured to close during a second phase interval of the clock signal, where the first phase interval and the second phase interval are disjoint intervals. For example, in FIGS. 6A and 6B, the $\phi 1$ switches and the $\phi 2$ switches correspond respectively to the first set and the second set of switches.

In one embodiment, the first set of switches and the second set of switches are PMOS transistors. In another embodiment, the first set of switches and the second set of switches are NMOS transistors. In yet another embodiment, the first set of switches and the second set of switches comprise a mixture of PMOS transistors and NMOS transistors.

In some embodiments, the sampling capacitors include a pair of input capacitors that are configured to capture the first charge sample, where a capacitance of the input capacitors is greater than a capacitance of the integration capacitors. This capacitance constraint implies that the voltage drop will experience a gain G larger than one.

In some embodiments, the sampling capacitors include a pair of input capacitors that are configured to capture the first charge sample, where the SCI includes a first pair of gated connections respectively between the two nodes and the pair of input capacitors, where the SCI also includes a second pair of gated cross connections respectively between the two nodes and the pair of input capacitors. As used herein, the term "gated connection" means a connection that includes a switch which selectively enables or disables the connection based on a control signal.

In some embodiments, the SCI includes an operational transconductance amplifier (OTA).

In some embodiments, the SCI is configured to reset the total accumulated charge on the integration capacitors to zero at the end of the measurement interval, in preparation for the next measurement.

Figure 9:
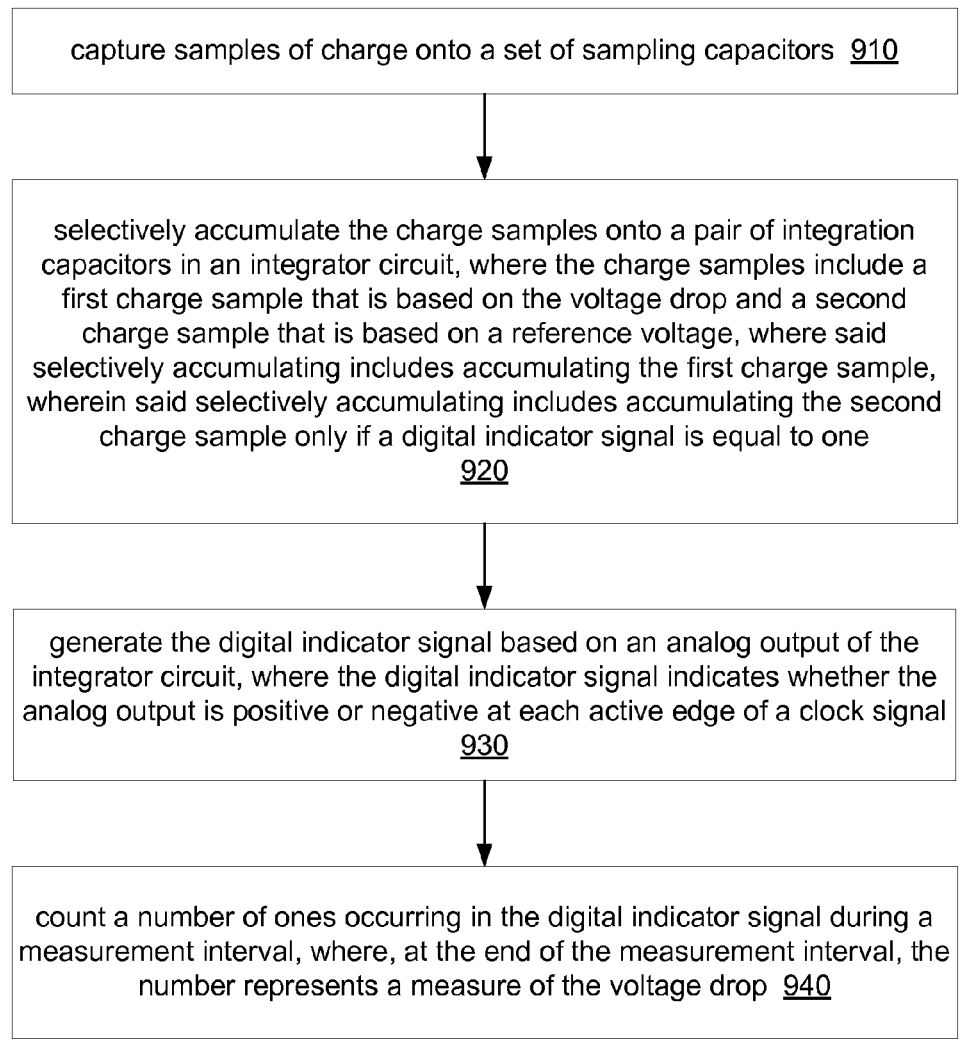
FIG. 9 illustrates one set of embodiments of a method for measuring voltage drop between two nodes in an electrical circuit.

In one set of embodiments, a method 900 for measuring a voltage drop between two nodes in an electrical circuit may involve the following operations, as shown in FIG. 9.

At 910, samples of charge are captured onto a set of sampling capacitors.

At 920, the charge samples are selectively accumulated onto a pair of integration capacitors in an integrator circuit, where the charge samples include a first charge sample that is based on the voltage drop and a second charge sample that is based on a reference voltage. The action of selectively accumulating includes accumulating the first charge sample. The action of selectively accumulating also includes accumulating the second charge sample only if a digital indicator signal equals one.

At 930, the digital indicator signal is generated based on an analog output of the integrator circuit, where the digital indicator signal indicates whether the analog output is positive or negative at each active edge of a clock signal, At 940, a counter may count the number of ones occurring in the digital indicator signal during a measurement interval, where, at the end of the measurement interval, the count value represents a measure of the voltage drop.

In some embodiments, the electrical circuit includes a resistor coupled between the two nodes, and method 900 also includes computing a current through the resistor based on the count value and on a known resistance value of the resistor.

In some embodiments, the electrical circuit includes a resistor coupled between the two nodes, and method 900 also includes computing a power delivered to a load based on the count value and a known value of voltage at one of the two nodes, or, based on the count value and a known resistance value of the load.

In some embodiments, the electrical circuit includes a resistor coupled between the two nodes, and method 900 also includes computing a power delivered by a battery charger to a battery based on the count value and a known value of voltage at one of the two nodes, or, based on the count value and a known resistance value of the battery.

In some embodiments, the charge samples (that are captured onto the sampling capacitors) also include a third charge sample that is based on an offset voltage.

Figure 10:
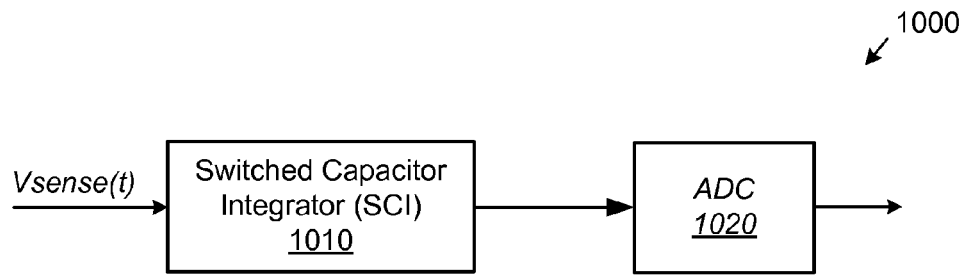
FIG. 10 illustrates another set of embodiments of a system for measuring voltage drop between two nodes in an electrical circuit.

In one set of embodiments, a system 1000 for measuring a voltage drop between two nodes in an electrical circuit may be configured as shown in FIG. 10. System 1010 may include a switched capacitor integrator (SCI) and an analog-to-digital converter (ADC) 1020.

The SCI 1010 may be coupled to the two nodes, and may be configured to alternately (a) capture charge onto a set of sampling capacitors and (b) transfer the charge onto a pair of integration capacitors, where the charge include at least a first charge component that is based on the voltage drop. The SCI may be configured to generate an output signal that represents an amplification of the voltage drop.

ADC 1020 may be configured to capture measurements of the output signal. The measurements of the output signal represent measurements of the voltage drop. The SCI is configured to zero out any charge on the integration capacitors after the ADC captures each measurement of the output signal.

In some embodiments, the ADC 1020 is a dual slope ADC. In other embodiments, the ADC 1020 is a pipelined ADC. In yet other embodiments, the ADC is a delta-sigma ADC.

In some embodiments, the charge (that is captured onto the sampling capacitors) also includes a second charge component that is based on an offset voltage.

Figure 11:
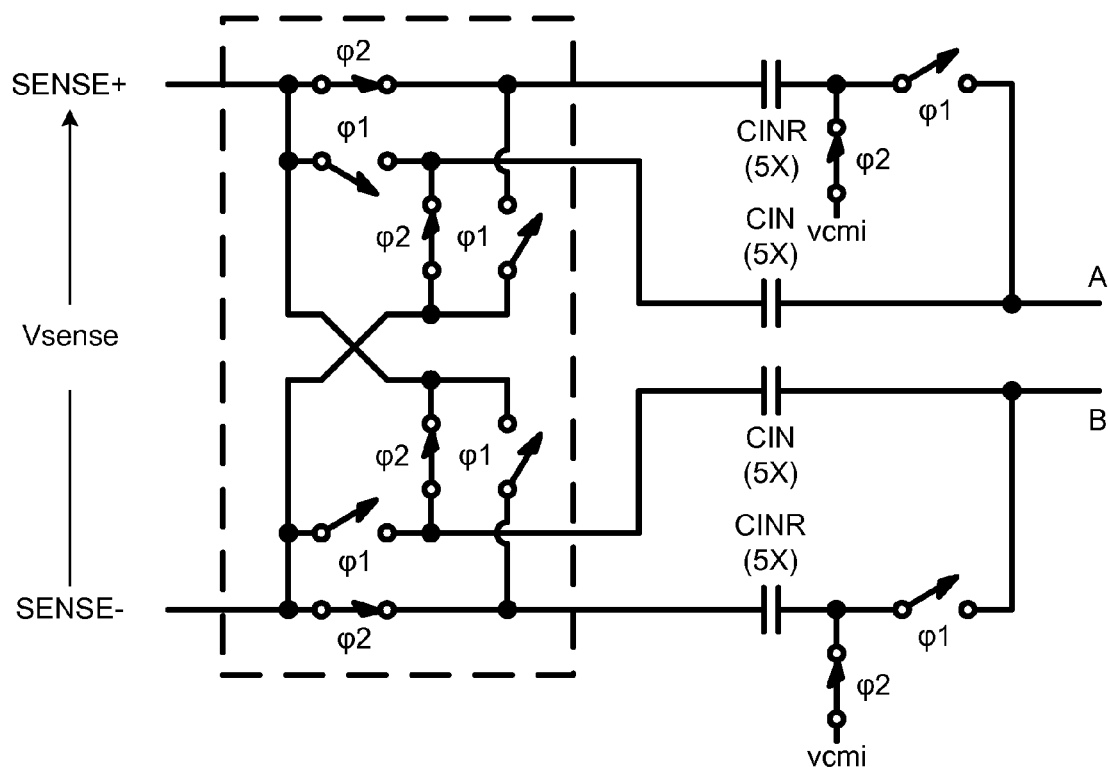
FIG. 11 illustrates a modified version of the circuit of FIG. 6B, where the voltage offset feature has been removed.

FIG. 11 shows a modified version of FIG. 6A, where the voltage offset feature has been removed. Thus, an input stage comprising the combination of FIG. 11 and FIG. 6B might be used in situations where one can assume the voltage drop is always positive.

Figure 12:
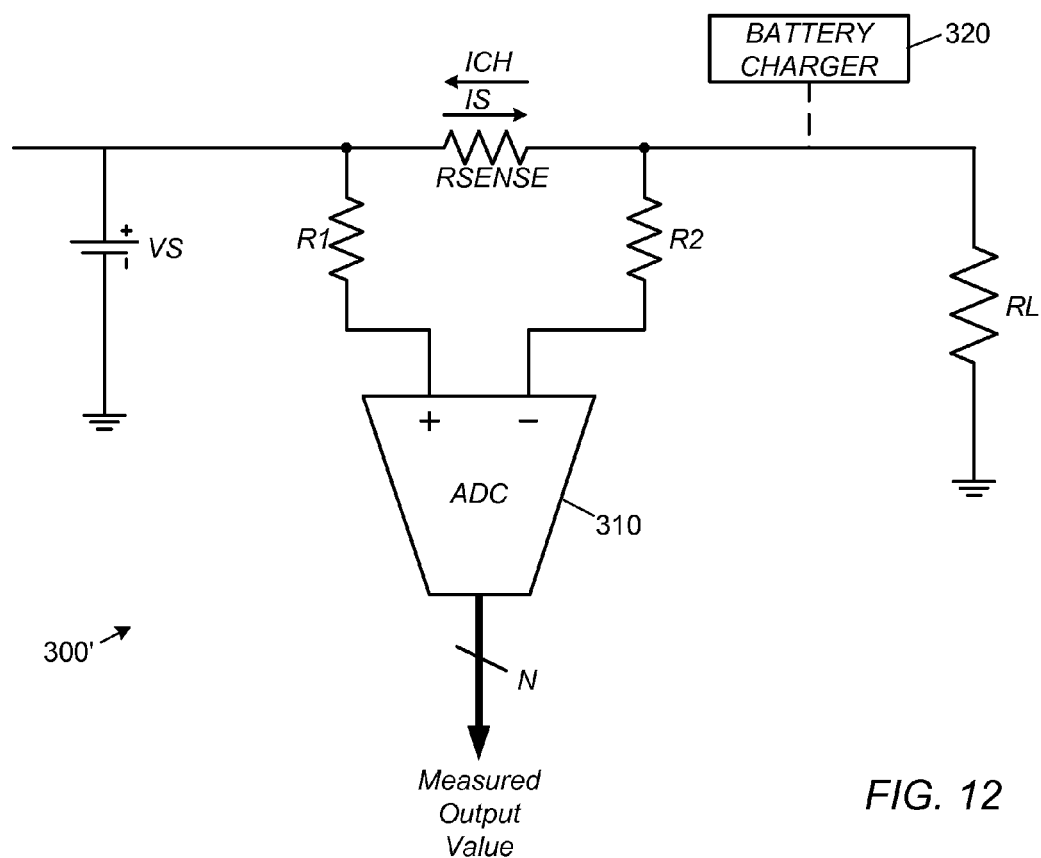
FIG. 12 illustrates an alternative embodiment for the system of FIG. 3.

FIG. 12 shows an alternative embodiment 300' for the system of FIG. 3. The alternative embodiment 300' includes resistors R1 and R2 coupled, respectively, between the ends of the sense resistor RSENSE and the inputs of the ADC 310. The resistors R1 and R2 may serve to limit the bandwidth of the Vsense signal. Furthermore, the resistors R1 and R2 may provide a measure of protection from electrostatic discharge (ESD) events. Resistors R1 and R2 are preferably equal (or approximately equal) in resistance. A similar alternative embodiment is contemplated for the system of FIG. 7, i.e., where resistors R1 and R2 couple, respectively, between the ends of the sense resistor and the inputs of front end 710.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

What is claimed is:

1. A system for measuring a voltage drop between two nodes in an electrical circuit, the system comprising:
    a switched capacitor integrator (SCI) coupled to the two nodes and configured to alternately (a) capture samples of charge onto a set of sampling capacitors and (b) selectively accumulate the charge samples onto a pair of integration capacitors, wherein the charge samples include a first charge sample based on the voltage drop and a second charge sample based on a reference voltage, wherein said selectively accumulating includes accumulating the first charge sample, wherein said selectively accumulating includes accumulating the second charge sample only if a digital indicator signal equals one, wherein the SCI is configured to generate an analog output signal that corresponds to a total accumulated charge on the integration capacitors;
    a comparator circuit configured to generate the digital indicator signal based on the analog output signal, wherein the digital indicator signal indicates whether the analog output signal is positive or negative at each active edge of a clock signal;
    a counter configured to count a number of ones occurring in the digital indicator signal during a measurement interval, wherein, at the end of the measurement interval, the number represents a measure of the voltage drop.

2. The system of claim 1, wherein the electrical circuit includes a battery, a load, and a sense resistor, wherein the two nodes correspond to the two ends of the sense resistor.

3. The system of claim 1, wherein the electrical circuit includes a battery, a battery charger and a sense resistor, wherein the two nodes correspond to the two ends of the sense resistor.

4. The system of claim 1, wherein the electrical circuit includes a resistor coupled between the two nodes, wherein the system further comprises:
    a means for computing a current through the resistor based on said number and a known resistance value of the resistor.

5. The system of claim 1, wherein the charge samples also include a third charge sample that is based on an offset voltage.

6. The system of claim 5, wherein the offset voltage is set equal to one-half of the reference voltage.

7. The system of claim 1, wherein the analog output signal equals an integral of a signal given by the expression: $G1*Vsense-G2*VREF*dout$, wherein Vsense is the voltage drop, wherein VREF is the reference voltage, wherein dout is the digital indicator signal, wherein G1 and G2 are gain factors determined by capacitances of the sampling capacitors and capacitances of the integration capacitors.

8. The system of claim 1, wherein the SCI includes a first set of switches and a second set of switches, wherein switches of the first set are configured to close during a first phase interval of the clock signal, wherein switches of the second set are configured to close during a second phase interval of the clock signal, wherein the first phase interval and the second phase interval are disjoint intervals.

9. The system of claim 1, wherein the sampling capacitors include a pair of input capacitors configured to capture the first charge sample, wherein the sampling capacitors also include a pair of reference capacitors configured to capture the second charge sample, wherein a ratio of a capacitance of the input capacitors to a capacitance of the reference capacitors is set to obtain a desired voltage gain of said system.

10. The system of claim 1, wherein the sampling capacitors include a pair of input capacitors that are configured to capture the first charge sample, wherein the capacitance of the input capacitors is greater than a capacitance of the integration capacitors.

11. The system of claim 1, wherein the sampling capacitors include a pair of input capacitors that are configured to capture the first charge sample, wherein the SCI includes a first pair of gated connections between the two nodes and the pair of input capacitors, wherein the SCI also includes a second pair of gated cross connections between the two nodes and the pair of input capacitors.

12. The system of claim 1, wherein the SCI includes an operational transconductance amplifier (OTA).

13. The system of claim 1, wherein the SCI is configured to reset the total accumulated charge on the integration capacitors to zero at the end of the measurement interval.

14. A method for measuring a voltage drop between two nodes in an electrical circuit, the method comprising:
    capturing samples of charge onto a set of sampling capacitors;
    selectively accumulating the charge samples onto a pair of integration capacitors in an integrator circuit, wherein the charge samples include a first charge sample that is based on the voltage drop and a second charge that is based on a reference voltage, where said selectively accumulating includes accumulating the first charge sample, wherein said selectively accumulating includes accumulating the second charge sample only if a digital indicator signal equals one;
    generating the digital indicator signal based on an analog output of the integrator circuit, wherein the digital indicator signal indicates whether the analog output is positive or negative at each active edge of a clock signal;
    counting a number of ones occurring in the digital indicator signal during a measurement interval, wherein, at the end of the measurement interval, the number represents a measure of the voltage drop.

15. The method of claim 14, wherein the electrical circuit includes a resistor coupled between the two nodes, wherein the method further comprises:
    computing a current through the resistor based on said number and a known resistance value of the resistor.

16. The method of claim 14, wherein the electrical circuit includes a resistor coupled between the two nodes, wherein the method further comprises:
    computing a power delivered to a load based on said number and a known value of voltage at one of the two nodes.

17. The method of claim 14, wherein the charge samples also include a third charge sample that is based on an offset voltage.

18. A system for measuring a voltage drop between two nodes in an electrical circuit, the system comprising:
    a switched capacitor integrator (SCI) coupled to the two nodes and configured to alternately (a) capture charge onto a set of sampling capacitors and (b) transfer the charge onto a pair of integration capacitors, wherein the charge includes at least a first charge component that is based on the voltage drop, wherein the SCI is configured to generate an output signal that represents an amplification of the voltage drop;
    an analog-to-digital converter (ADC) configured to capture measurements of the output signal, wherein the measurements of the output signal represents measurements of the voltage drop, wherein the SCI is configured to zero any charge on the integration capacitors after the ADC captures each measurement of the output signal.

19. The system of claim 18, wherein the ADC is a dual slope ADC.

20. The system of claim 18, wherein the ADC is a pipelined ADC.

21. The system of claim 18, wherein the ADC is a delta-sigma ADC.

22. The system of claim 18, wherein the charge also includes a second charge component that is based on an offset voltage.

* * * * *